(12) United States Patent
Oomori

(10) Patent No.: US 11,070,206 B2
(45) Date of Patent: Jul. 20, 2021

(54) LOGIC CIRCUIT

(71) Applicant: LAPIS Semiconductor Co., Ltd., Yokohama (JP)

(72) Inventor: Tetsuo Oomori, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/803,606

(22) Filed: Feb. 27, 2020

(65) Prior Publication Data
US 2020/0313673 A1 Oct. 1, 2020

(30) Foreign Application Priority Data

Mar. 26, 2019 (JP) .............................. JP2019-059398

(51) Int. Cl.
*H03K 19/00* (2006.01)
*H03K 19/003* (2006.01)
*H03K 19/0185* (2006.01)

(52) U.S. Cl.
CPC ... *H03K 19/00315* (2013.01); *H03K 19/0013* (2013.01); *H03K 19/0016* (2013.01); *H03K 19/018521* (2013.01)

(58) Field of Classification Search
CPC ....... H03K 19/0013; H03K 19/018521; H03K 17/04123; H03K 17/063; H03K 17/0822; H03K 17/223; H03K 17/687; H03K 19/0027; H03K 19/00315; H03K 19/0948; H03K 19/0963; H03K 3/012; H03K 19/00361; H03K 17/102; H03K 19/01721; H03K 19/17744; H03K 19/215; H03K 3/0375; H01L 27/0255; H01L 27/092; H01L 29/6609; H01L 29/861; G11C 7/10

See application file for complete search history.

(56) References Cited

U.S. PATENT DOCUMENTS

| | | | | |
|---|---|---|---|---|
| 6,100,720 A * | 8/2000 | Kumagai | ........... | H03K 19/0019 326/121 |
| 6,137,313 A * | 10/2000 | Wong | ................. | H03K 19/0013 326/83 |
| 6,744,107 B1* | 6/2004 | Ker | ..................... | H01L 27/0266 257/355 |
| 6,920,026 B2* | 7/2005 | Chen | .................... | H01L 27/0266 361/56 |
| 8,013,630 B2* | 9/2011 | Ito | ..................... | H03K 19/09425 326/60 |
| 8,969,914 B2* | 3/2015 | Chalamala | .......... | H01L 27/0285 257/174 |
| 2008/0135940 A1* | 6/2008 | Hashigami | ............ | H01L 27/092 257/357 |

FOREIGN PATENT DOCUMENTS

JP H09214313 A 8/1997

* cited by examiner

*Primary Examiner* — Vibol Tan
(74) *Attorney, Agent, or Firm* — Rabin & Berdo, P.C.

(57) ABSTRACT

A logic circuit includes an inverter that outputs from an output terminal a signal created by inverting the logic of a signal input into an input terminal, a first transistor that is connected to the input terminal in such a way as to maintain an OFF state, and a second transistor that is connected to the output terminal in such a way as to maintain an OFF state.

14 Claims, 9 Drawing Sheets

COMPARATIVE EXAMPLE

COMPARATIVE EXAMPLE

COMPARATIVE EXAMPLE

COMPARATIVE EXAMPLE

COMPARATIVE EXAMPLE

COMPARATIVE EXAMPLE

COMPARATIVE EXAMPLE

COMPARATIVE EXAMPLE

LOGIC CIRCUIT

CROSS-REFERENCE TO RELATED APPLICATION

This application is based on and claims priority under 35 USC 119 from Japanese Patent Application No. 2019-059398 filed on Mar. 26, 2019, the disclosure of which is incorporated by reference herein.

BACKGROUND

Technical Field

The present disclosure relates to a logic circuit.

Related Art

The following technology is known as technology relating to a logic circuit that includes a CMOS (Complementary Metal-Oxide Semiconductor) inverter.

A CMOS inverter circuit in which a first P-channel FET and an N-channel FET are connected together in series and are connected between a power supply and a ground, and a gate of the first P-channel FET and a gate of the N-channel FET are connected to an input terminal, and the connection point between the first P-channel FET and the N-channel FET is connected to an output terminal is described in, for example, Japanese Unexamined Patent Application Laid-Open (JP-A) No. H09-214313 (Patent Document 1). This CMOS inverter circuit has a switch control device that connects a switch element and a second P-channel that is connected in series to this switch element in parallel to the first P-channel FET, and connects a gate of the second P-channel FET to an input terminal, and when the voltage of the power supply, which is being monitored, exceeds a predetermined value, turns ON the switch element.

In a CMOS inverter that is formed so as to include an N-channel type of MOSFET (Metal-Oxide-Semiconductor Field-Effect Transistor) and a P-channel type of MOSFET, during a transition period between a point when the power supply is turned on and a point when the power supply voltage rises to a prescribed level, in some cases a phenomenon occurs in which the input of the CMOS inverter is undefined and the output thereof is undefined, or alternatively, the output logic is inverted. As a consequence of this, the problem has sometimes arisen that a signal having an unintended logic level is output from the CMOS inverter, resulting in the system malfunctioning.

SUMMARY

The present disclosure was conceived in consideration of the above-described problems and it is an object thereof to provide a logic circuit that makes it possible to inhibit a signal having an unintended logic level from being output when a power supply is turned on.

A logic circuit according to the present disclosure includes an inverter that outputs from an output terminal a signal created by inverting the logic of a signal input into an input terminal, a first transistor that is connected to the input terminal in such a way as to maintain an OFF state, and a second transistor that is connected to the output terminal in such a way as to maintain an OFF state.

According to the present disclosure there is provided a logic circuit that makes it possible to inhibit a signal having an unintended logic level from being output when a power supply is turned on.

BRIEF DESCRIPTION OF THE DRAWINGS

Exemplary embodiments of the present disclosure will be described in detail based on the following figures, wherein:

FIG. 3A is a view showing an example of a voltage waveform of each node when a power supply of the circuit block according to the comparative example is turned on;

FIG. 3B is a view showing an example of a voltage waveform of each node when the power supply of the circuit block according to the comparative example is turned on;

FIG. 3C is a view showing an example of a voltage waveform of each node when the power supply of the circuit block according to the comparative example is turned on;

FIG. 7 is a view showing an example of a voltage waveform of each node when a power supply of the circuit block according to the exemplary embodiment of the present disclosure is turned on;

FIG. 10 is a view showing an example of a voltage waveform of each node when the power supply of the circuit block according to the exemplary embodiment of the present disclosure is turned on;

FIG. 12 is a view showing an example of a voltage waveform of each node when the power supply of the circuit block according to the exemplary embodiment of the present disclosure is turned on;

FIG. 14 is a view showing an example of a voltage waveform of each node when the power supply of the circuit block according to the exemplary embodiment of the present disclosure is turned on.

DETAILED DESCRIPTION

Firstly, before a logic circuit according to exemplary embodiments of the present disclosure is described, a logic circuit according to a comparative example will be described.

Figure 1:
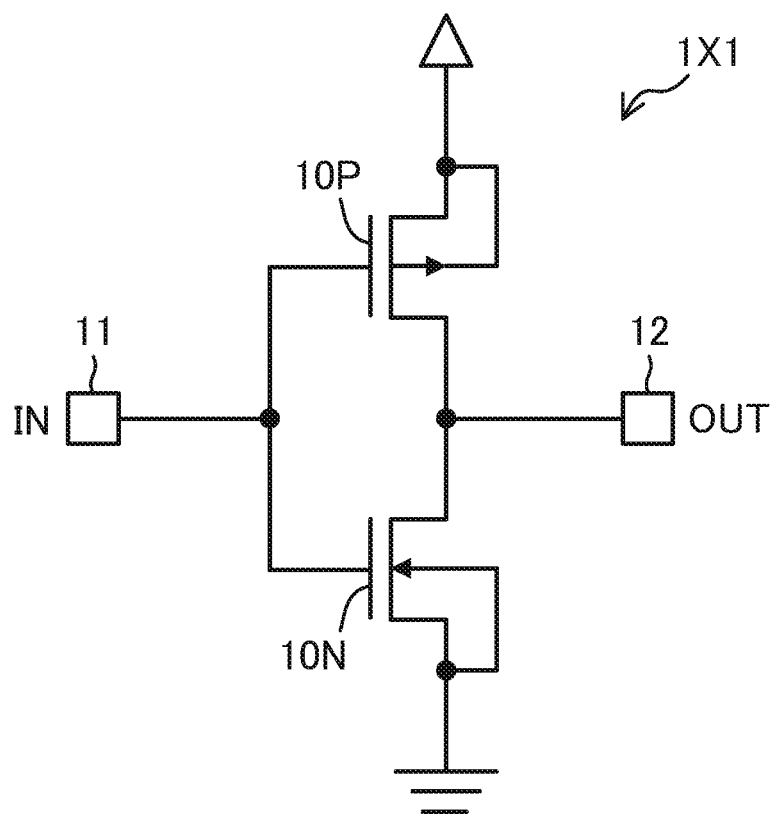
FIG. 1 is a view showing an example of a structure of a logic circuit according to a comparative example.

FIG. 1 is a view showing an example of the structure of a logic circuit 1X1 according to a comparative example. The logic circuit 1X1 according to the comparative example forms part of a typical CMOS inverter, and is formed so as to include a P-channel type of MOSFET 10P that is connected to a power supply line, and an N-channel type of MOSFET 10N that is connected to a ground line. A gate of the MOSFET 10P and a gate of the MOSFET 10N are each connected to an input terminal 11, while a drain of the MOSFET 10P and a drain of the MOSFET 10N are each connected to an output terminal 12.

Figure 2:
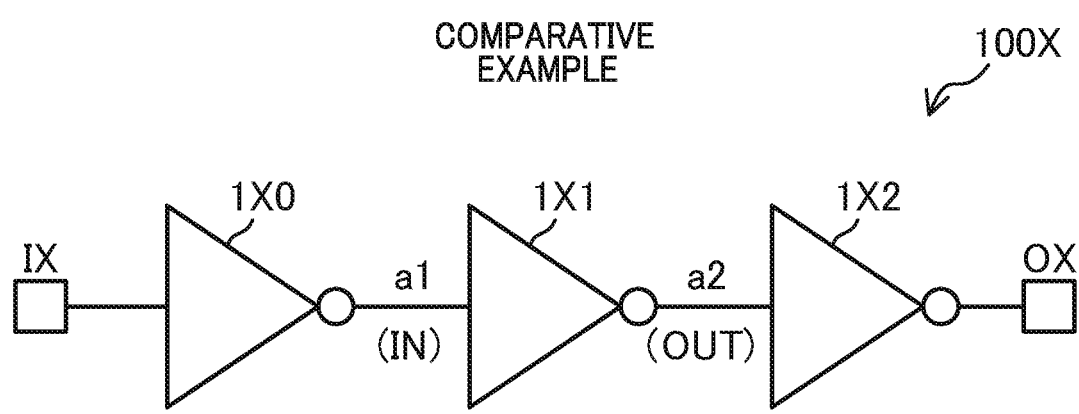
FIG. 2 is a view showing a structure of a circuit block according to the comparative example.

FIG. 2 is a view showing the structure of a circuit block 100X that is formed so as to include the logic circuit 1X1 according to the comparative example. The circuit block 100X is formed so as to include the logic circuit 1X1, a logic circuit 1X0 that is provided at the stage immediately preceding the logic circuit 1X1, and a logic circuit 1X2 that is provided at the stage immediately following the logic circuit 1X1. In other words, the circuit block 100X is formed by cascode-connecting the logic circuits 1X0, 1X1, and 1X2. The logic circuits 1X0 and 1X2 have the same structure as the logic circuit 1X1 shown in FIG. 1.

When the power supply is turned on, a power supply voltage VDD rises to a prescribed level, and until a system input is confirmed, a potential of an input node IX of the circuit block 100X remains undefined (i.e., in a high impedance state). Here, a gate threshold value voltage Vth of the P-channel type MOSFET (hereinafter, this will be referred to as a PMOS) is taken as Vtp, and the leakage current thereof is taken as Ipk. Moreover, a gate threshold value voltage Vth of the N-channel type MOSFET (hereinafter, this will be referred to as an NMOS) is taken as Vtn, and the leakage current thereof is taken as Ink.

Figure 3A:
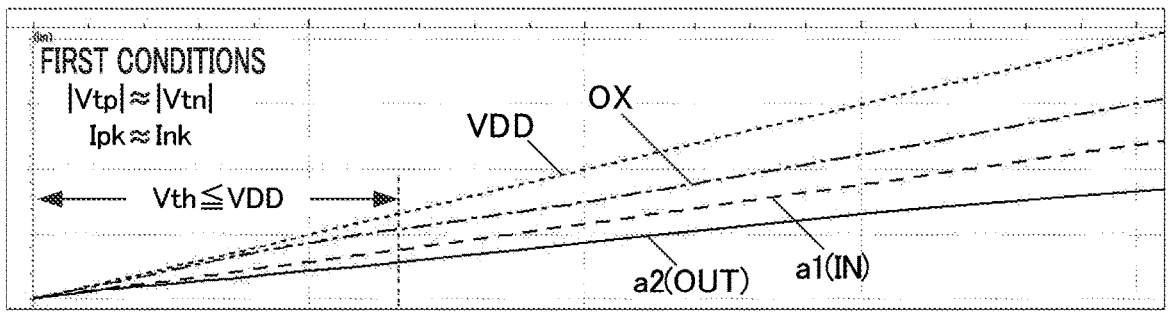

FIG. 3A shows an example of a voltage waveform of each node when the power supply of the circuit block 100X according to the comparative example is turned on when first conditions (|Vtp|≈|Vtn| and Ipk≈Ink, e.g. |Vtp| is nearly equal to |Vtn| and Ipk is nearly equal to Ink) are satisfied. When the first conditions are satisfied, the potentials of an output node a1 of the logic circuit 1X0, of an output node a2 of the logic circuit 1X1, and of an output node OX of the logic circuit 1X2 are each undefined. In areas as well where the power supply voltage VDD is smaller than the MOSFET gate threshold value voltage Vth (i.e., where Vth≤VDD), the potentials of the nodes a1, a2, and OX are each undefined. Note that in the areas where Vth≤VDD, the effects of the MOSFET leakage currents are dominant. The state shown in FIG. 3A is a state in which Ipk and Ink are mutually balanced.

Figure 3B:
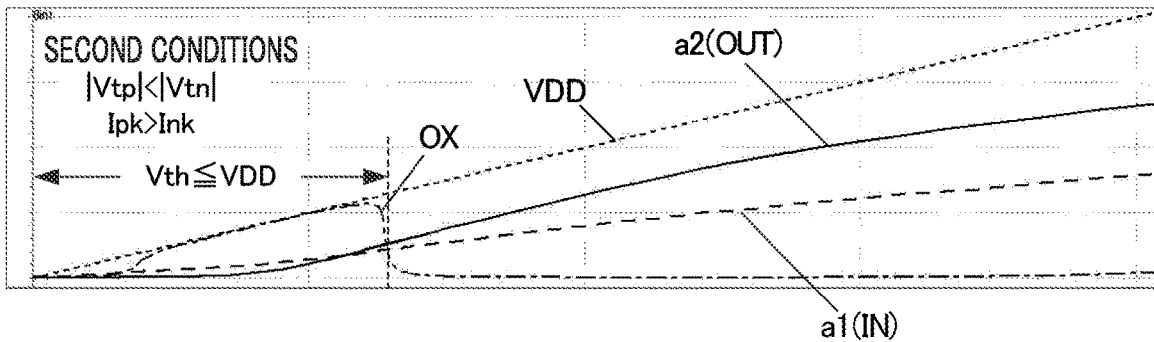

FIG. 3B shows an example of a voltage waveform of each node when the power supply of the circuit block 100X according to the comparative example is turned on when second conditions (|Vtp|<|Vtn| and Ipk>Ink) are satisfied. When the second conditions are satisfied, operations are dependent on the PMOS. In this case, in the areas where Vth≤VDD, PMOS characteristics are evident while NMOS remains substantially inoperative. The potential of the output node OX of the logic circuit 1X2 is raised to a high level by the PMOS leakage current. Thereafter, if the level of the power supply voltage VDD increases, NMOS characteristics begin to appear (in other words, the NMOS begins to operate), and the potential of the output node OX is inverted to a low level. In other words, when the second conditions are satisfied, during the transition period after the power supply is turned on, the potential of the output node OX is inverted from a high level to a low level by the states of the logic circuits 1X0 and 1X1.

Figure 3C:
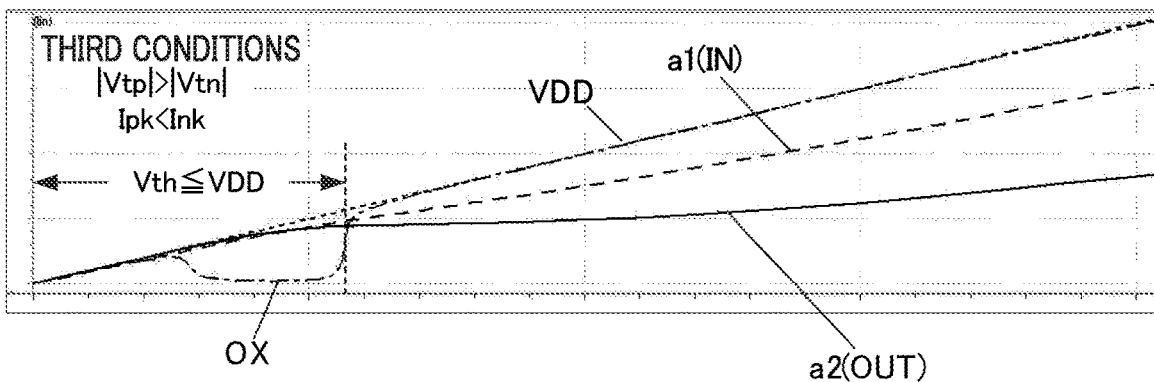

FIG. 3C shows an example of a voltage waveform of each node when the power supply of the circuit block 100X according to the comparative example is turned on when third conditions (|Vtp|>|Vtn| and Ipk<Ink) are satisfied. When the third conditions are satisfied, operations are dependent on the NMOS. In this case, in the areas where Vth≤VDD, NMOS characteristics are evident while PMOS remains substantially inoperative. The potential of the output node OX of the logic circuit 1X2 is dropped to a low level by the NMOS leakage current. Thereafter, if the level of the power supply voltage VDD increases, PMOS characteristics begin to appear (in other words, the PMOS begins to operate), and the potential of the output node OX is inverted to a high level. In other words, when the third conditions are satisfied, during the transition period after the power supply is turned on, the potential of the output node OX is inverted from a low level to a high level by the states of the logic circuits 1X0 and 1X1.

In this way, according to the circuit block 100X which includes the logic circuit 1X1 according to the comparative example, during the transition period after the power supply is turned on, the potential of the output node OX is either undefined or is inverted because of variations in the MOSFET characteristics. As a consequence, a signal having an unintended logic level is output, and there is a possibility of the system malfunctioning. A degree of improvement might be expected by adjusting the size ratio between the PMOS and the NMOS, however, because of the variations in the MOSFET characteristics, the above-described problems may not be completely solved.

Figure 4A:
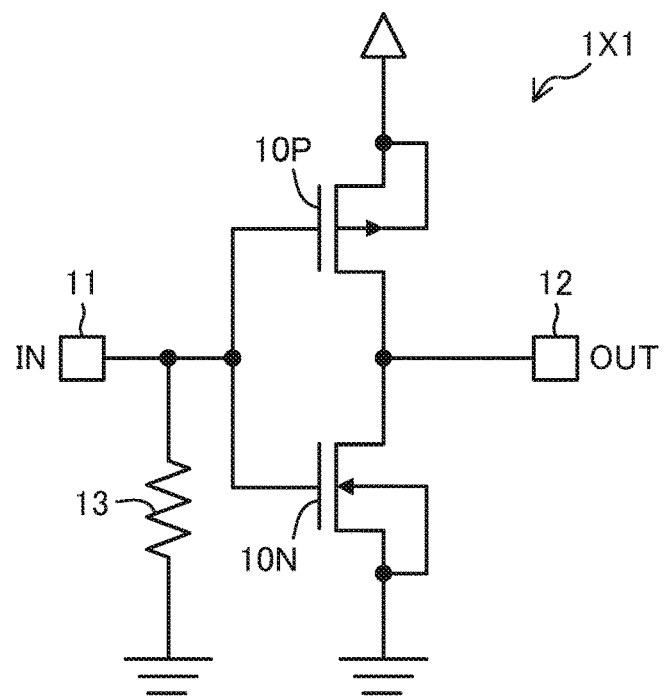
FIG. 4A is a view showing an example of the structure of the logic circuit according to the comparative example.
Figure 4B:
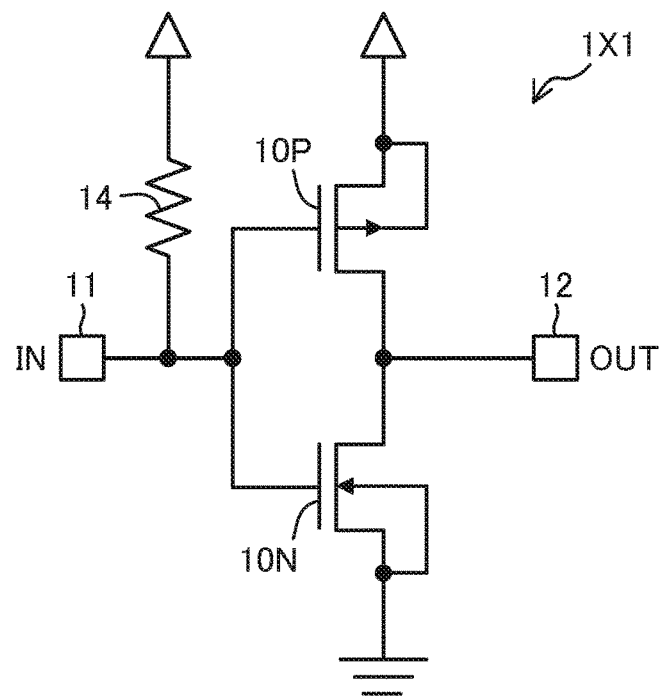
FIG. 4B is a view showing an example of the structure of the logic circuit according to the comparative example.
Figure 4C:
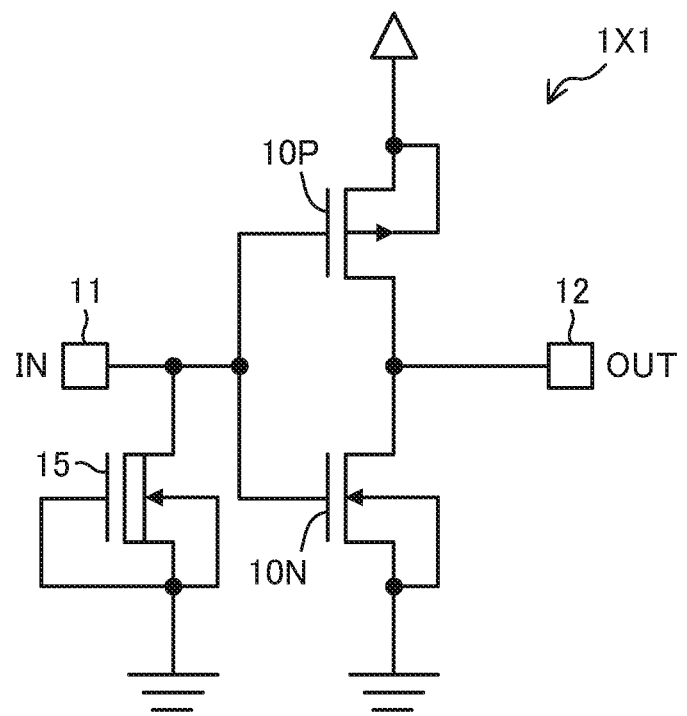
FIG. 4C is a view showing an example of the structure of the logic circuit according to the comparative example.

FIG. 4A, FIG. 4B, and FIG. 4C show examples of structures of the logic circuit according to the comparative example that enable output node instabilities to be inhibited. The logic circuit 1X1 shown in FIG. 4A has a resistance element 13 provided between the input terminal 11 and the ground line. The logic circuit 1X1 shown in FIG. 4B has a resistance element 14 provided between the power supply line and the input terminal 11. The logic circuit 1X1 shown in FIG. 4C has a DMOS (Double-Diffused MOSFET) 15 provided between the input terminal 11 and the ground line. According to the logic circuits 1X1 shown in FIG. 4A through FIG. 4C, while it is possible to inhibit instabilities in the potentials of the output nodes when the power supply is turned on, because current is being constantly supplied to the resistance elements 13 and 14 and to the DMOS 15, the problem arises that power consumption increases.

Hereinafter, exemplary embodiments of the present disclosure will be described with reference to the drawings. Note that component elements or portions thereof that are essentially the same or equivalent in the respective drawings are given the same descriptive symbols.

First Exemplary Embodiment

Figure 5:
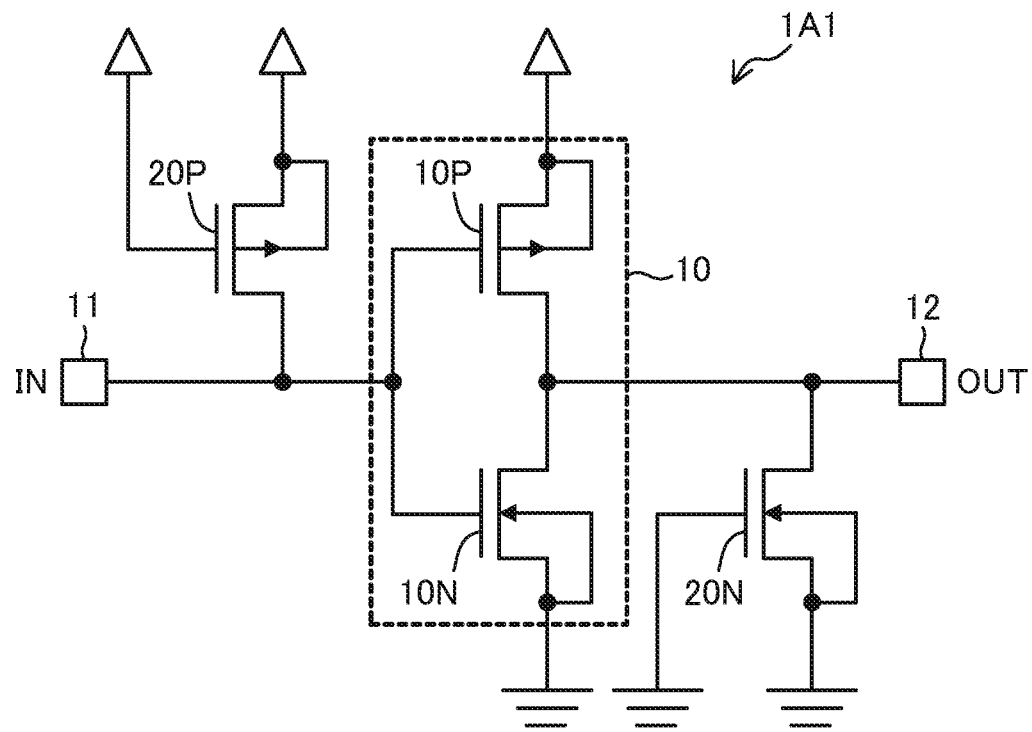
FIG. 5 is a view showing an example of a structure of a logic circuit according to an exemplary embodiment of the present disclosure.

FIG. 5 shows an example of the structure of a logic circuit 1A1 according to a first exemplary embodiment of the present disclosure. The logic circuit 1A1 can be formed on a single semiconductor chip. The logic circuit 1A1 is formed so as to include an inverter 10 that outputs from an output terminal 12 a signal created by inverting the logic of a signal input into the input terminal 11. The inverter 10 has a P-channel type of MOSFET 10P, and an N-channel type of MOSFET 10N. A source of the MOSFET 10P is connected to a power supply line, a gate thereof is connected to the input terminal 11, and a drain thereof is connected to the output terminal 12. A source of the MOSFET 10N is connected to a ground line, a gate thereof is connected to the input terminal 11, and a drain thereof is connected to the output terminal 12.

Additionally, the logic circuit 1A1 has a P-channel type of MOSFET 20P that is connected to the input terminal 11 in such a way as to maintain an OFF state, and an N-channel type of MOSFET 20N that is connected to the output terminal 12 in such a way as to maintain an OFF state.

A source and a gate of the MOSFET 20P are connected to the power supply line, while a drain thereof is connected to the input terminal 11. The MOSFET 20P maintains an OFF state as a result of the source and gate thereof being connected to the power supply line. A source and a gate of the MOSFET 20N are connected to the ground line, while a drain thereof is connected to the output terminal 12. The MOSFET 20N maintains an OFF state as a result of the source and gate thereof being connected to the ground line.

Figure 6:
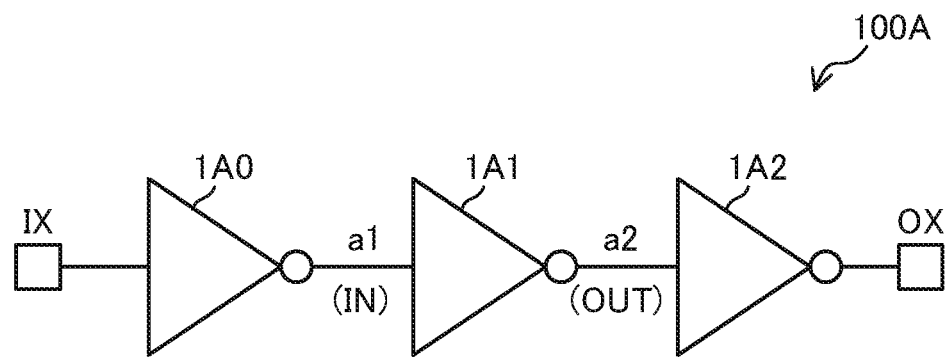
FIG. 6 is a view showing a structure of a circuit block according to the exemplary embodiment of the present disclosure.

FIG. 6 shows the structure of a circuit block 100A that is formed so as to include the logic circuit 1A1 according to the present exemplary embodiment. The circuit block 100A can be formed on a single semiconductor chip. The circuit block 100A is formed so as to include the logic circuit 1A1, a logic circuit 1A0 that is provided at the stage immediately preceding the logic circuit 1A1, and a logic circuit 1A2 that is provided at the stage immediately following the logic circuit 1A1. In other words, the circuit block 100A is formed by cascode-connecting the logic circuits 1A0, 1A1, and 1A2. The logic circuits 1A0 and 1A2 have the same structure as the logic circuit 1X1 according to the comparative example shown in FIG. 1.

Figure 7:
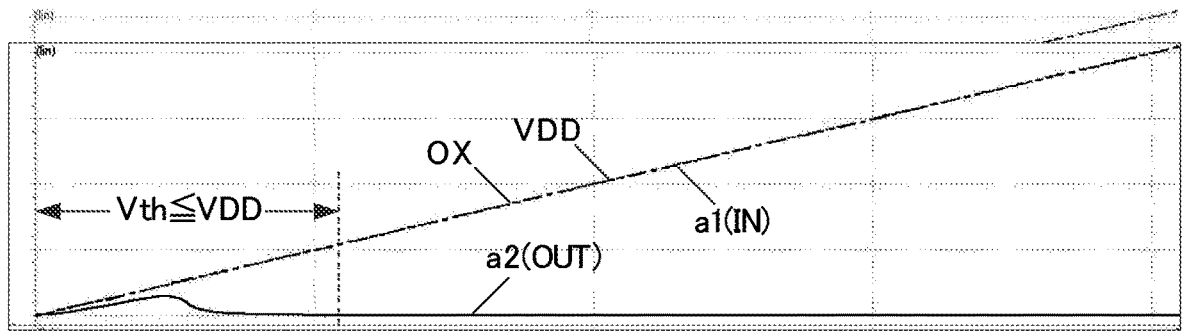

FIG. 7 shows an example of a voltage waveform of each node when the power supply of the circuit block 100A is turned on. In areas where the power supply voltage VDD is smaller than the MOSFET gate threshold value voltage Vth (i.e., where Vth≤VDD), in other words, in areas where the circuit is not operating normally, the effects of the MOSFET leakage currents are dominant. In such areas, the potential of the input terminal 11 of the logic circuit 1A1 is fixed at a high level by the leakage current of the MOSFET 20P which is connected to the input terminal 11. Additionally, the potential of the output terminal 12 of the logic circuit 1A1 is fixed at a low level by the leakage current of the MOSFET 20N which is connected to the output terminal 12. As a result, the potential of the output node OX of the subsequent logic circuit 1A2 is fixed at a high level.

According to the circuit block 100A which includes the logic circuit 1A1 according to the present exemplary embodiment, even if the above-described first conditions (|Vtp|≈|Vtn| and Ipk≈Ink, e.g. |Vtp| is nearly equal to |Vtn| and Ipk is nearly equal to Ink) are satisfied, the potential of the output node OX is not undefined, and even when the above-described second conditions (|Vtp|<|Vtn| and Ipk>Ink), or third conditions (|Vtp|>|Vtn| and Ipk<Ink) are satisfied, the potential of the output node OX is not inverted. In other words, it is possible to inhibit a signal having an unintended logic level from being output when the power supply is turned on. Accordingly, it is possible to suppress the risk of a system malfunction being generated when the power supply is turned on. Moreover, because the MOSFET 20P and the MOSFET 20N constantly maintain an OFF state, it is possible to inhibit an increase in the power consumption. Additionally, the MOSFET 20P and 20N do not affect circuit operations.

Second Exemplary Embodiment

Figure 8:
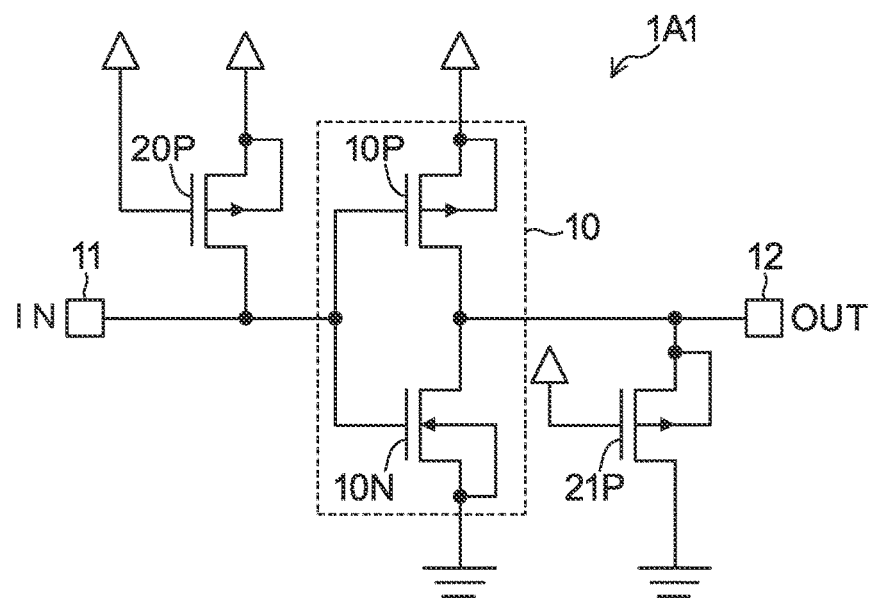
FIG. 8 is a view showing a structure of a circuit block according to another exemplary embodiment of the present disclosure.

FIG. 8 shows an example of the structure of the logic circuit 1A1 according to a second exemplary embodiment of the present disclosure. The logic circuit 1A1 is formed so as to include the inverter 10 that outputs from the output terminal 12 a signal created by inverting the logic of a signal input into the input terminal 11. The inverter 10 has the P-channel type of MOSFET 10P, and the N-channel type of MOSFET 10N. The source of the MOSFET 10P is connected to the power supply line, the gate thereof is connected to the input terminal 11, and the drain thereof is connected to the output terminal 12. The source of the MOSFET 10N is connected to the ground line, the gate thereof is connected to the input terminal 11, and the drain thereof is connected to the output terminal 12.

Additionally, the logic circuit 1A1 has the P-channel type of MOSFET 20P that is connected to the input terminal 11 in such a way as to maintain an OFF state, and a P-channel type of MOSFET 21P that is connected to the output terminal 12 in such a way as to maintain an OFF state.

The source and the gate of the MOSFET 20P are connected to the power supply line, while the drain thereof is connected to the input terminal 11. The MOSFET 20P maintains an OFF state as a result of the source and gate thereof being connected to the power supply line. The source of the MOSFET 21P is connected to the output terminal 12, the gate thereof is connected to the power supply line, and the drain thereof is connected to the ground line. The MOSFET 21P maintains an OFF state as a result of the gate thereof being connected to the power supply line.

According to the circuit block 100A which includes the logic circuit 1A1 according to the present exemplary embodiment (see FIG. 6), in the same way as in the circuit block 100A according to the first exemplary embodiment, in the areas where Vth≤VDD, the potential of the input terminal 11 of the logic circuit 1A1 is fixed at a high level by the leakage current of the MOSFET 20P which is connected to the input terminal 11. Additionally, the potential of the output terminal 12 of the logic circuit 1A1 is fixed at a low level by the leakage current of the MOSFET 21P which is connected to the output terminal 12. As a result, the potential of the output node OX of the subsequent logic circuit 1A2 is fixed at a high level.

According to the circuit block 100A which includes the logic circuit 1A1 according to the present exemplary embodiment, even if the above-described first conditions (|Vtp|≈|Vtn| and Ipk≈Ink, e.g. |Vtp| is nearly equal to |Vtn| and Ipk is nearly equal to Ink) are satisfied, the potential of the output node OX is not undefined, and even when the above-described second conditions (|Vtp|<|Vtn| and Ipk>Ink), or third conditions (|Vtp|>|Vtn| and Ipk<Ink) are satisfied, the potential of the output node OX is not inverted. In other words, it is possible to inhibit a signal having an unintended logic level from being output when the power supply is turned on. Accordingly, it is possible to suppress the risk of a system malfunction being generated when the power supply is turned on. Moreover, because the MOSFET 20P and the MOSFET 21P constantly maintain an OFF state, it is possible to inhibit an increase in the power consumption. Additionally, the MOSFET 20P and 21P do not affect circuit operations.

Third Exemplary Embodiment

Figure 9:
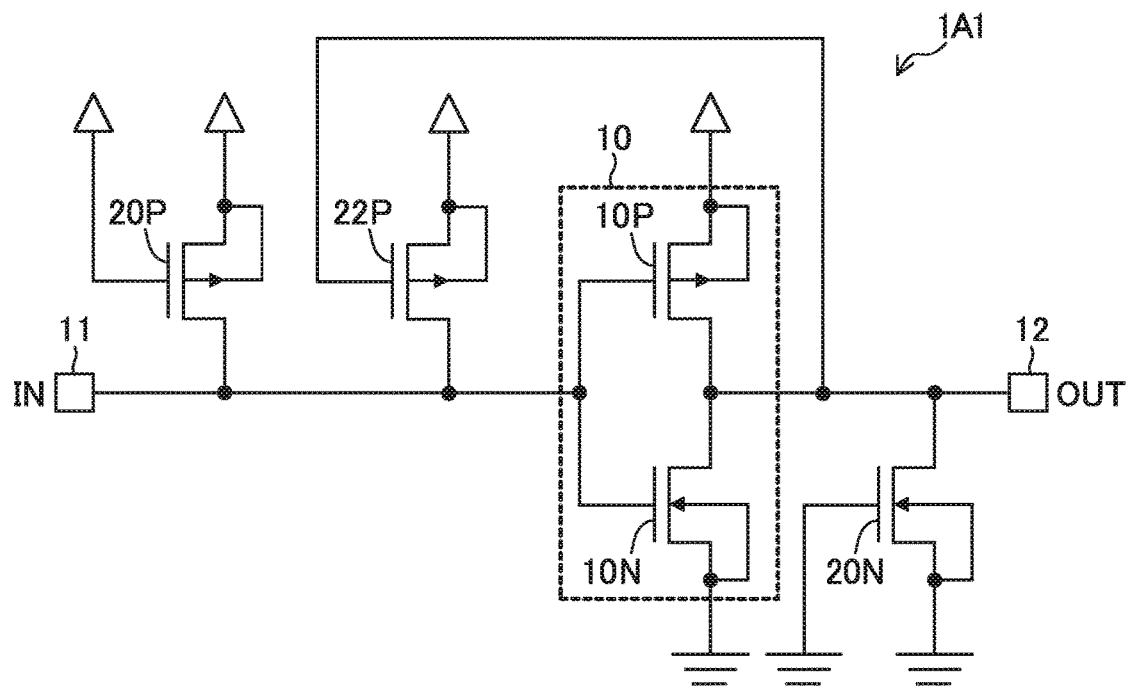
FIG. 9 is a view showing a structure of a circuit block according to another exemplary embodiment of the present disclosure.

FIG. 9 shows an example of the structure of the logic circuit 1A1 according to a third exemplary embodiment of the present disclosure. The logic circuit 1A1 is formed so as to include the inverter 10 that outputs from the output terminal 12 a signal created by inverting the logic of a signal input into the input terminal 11. The inverter 10 has the P-channel type of MOSFET 10P, and the N-channel type of MOSFET 10N. The source of the MOSFET 10P is connected to the power supply line, the gate thereof is connected to the input terminal 11, and the drain thereof is connected to the output terminal 12. The source of the MOSFET 10N is connected to the ground line, the gate thereof is connected to the input terminal 11, and the drain thereof is connected to the output terminal 12.

Additionally, the logic circuit 1A1 has the P-channel type of MOSFET 20P that is connected to the input terminal 11 in such a way as to maintain an OFF state, a P-channel type of MOSFET 22P that is connected to the input terminal 11 and enables a latch operation of the inverter 10 to be achieved when the power supply is turned on, and the N-channel type of MOSFET 20N that is connected to the output terminal 12 in such a way as to maintain an OFF state.

The source and the gate of the MOSFET 20P are connected to the power supply line, while the drain thereof is connected to the input terminal 11. The MOSFET 20P maintains an OFF state as a result of the source and gate thereof being connected to the power supply line. The source of the MOSFET 22P is connected to the power supply line, the gate thereof is connected to the output terminal 12, and the drain thereof is connected to the input terminal 11. The source and the gate of the MOSFET 20N are connected to the ground line, while the drain thereof is connected to the output terminal 12. The MOSFET 20N maintains an OFF state as a result of the source and gate thereof being connected to the ground line.

Figure 10:
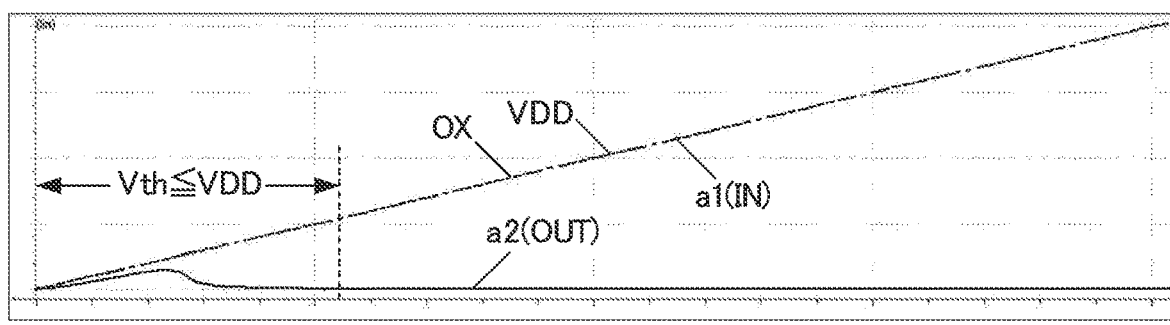

FIG. 10 shows an example of a voltage waveform of each node when the power supply of the circuit block 100A which includes the logic circuit 1A1 according to the present exemplary embodiment (see FIG. 6) is turned on. In areas where the power supply voltage VDD is smaller than the MOSFET gate threshold value voltage Vth (i.e., where Vth≤VDD), in other words, in areas where the circuit is not operating normally, the effects of the MOSFET leakage currents are dominant. In such areas, the potential of the input terminal 11 of the logic circuit 1A1 is fixed at a high level by the leakage current of the MOSFET 20P which is connected to the input terminal 11. Additionally, the potential of the output terminal 12 of the logic circuit 1A1 is fixed at a low level by the leakage current of the MOSFET 20N which is connected to the output terminal 12. Moreover, as a result of the potential of the output terminal 12 being fixed at a low level, the MOSFET 22P which is connected to the input terminal 11 of the logic circuit 1A1 maintains an ON state. As a result, a latch operation to maintain a state in which the potential of the input terminal 11 is set at a high level, and the potential of the output terminal 12 is set at a low level is achieved. As a result, the potential of the output node OX of the subsequent logic circuit 1A2 is fixed at a high level.

According to the circuit block 100A which includes the logic circuit 1A1 according to the present exemplary embodiment, even if the above-described first conditions (|Vtp|≈|Vtn| and Ipk≈Ink, e.g. |Vtp| is nearly equal to |Vtn| and Ipk is nearly equal to Ink) are satisfied, the potential of the output node OX is not undefined, and even when the above-described second conditions (|Vtp|<|Vtn| and Ipk>Ink), or third conditions (|Vtp|>|Vtn| and Ipk<Ink) are satisfied, the potential of the output node OX is not inverted. In other words, it is possible to inhibit a signal having an unintended logic level from being output when the power supply is turned on. Accordingly, it is possible to suppress the risk of a system malfunction being generated when the power supply is turned on. Moreover, the MOSFET 20P and the MOSFET 20N constantly maintain an OFF state, and the MOSFET 22P is placed in an ON state transiently, however, there is no constant supply of current thereto. Accordingly, it is possible to inhibit an increase in the power consumption. Additionally, the MOSFET 20P, 22P, and 20N do not affect circuit operations. Moreover, because a latch operation is achieved by the MOSFET 22P, the stability of operations when the power supply is turned on can be further heightened.

Note that it is also possible for the MOSFET 22P according to the present exemplary embodiment to be connected to the input terminal 11 of the logic circuit 1A1 according to the second exemplary embodiment (see FIG. 8).

Fourth Exemplary Embodiment

Figure 11:
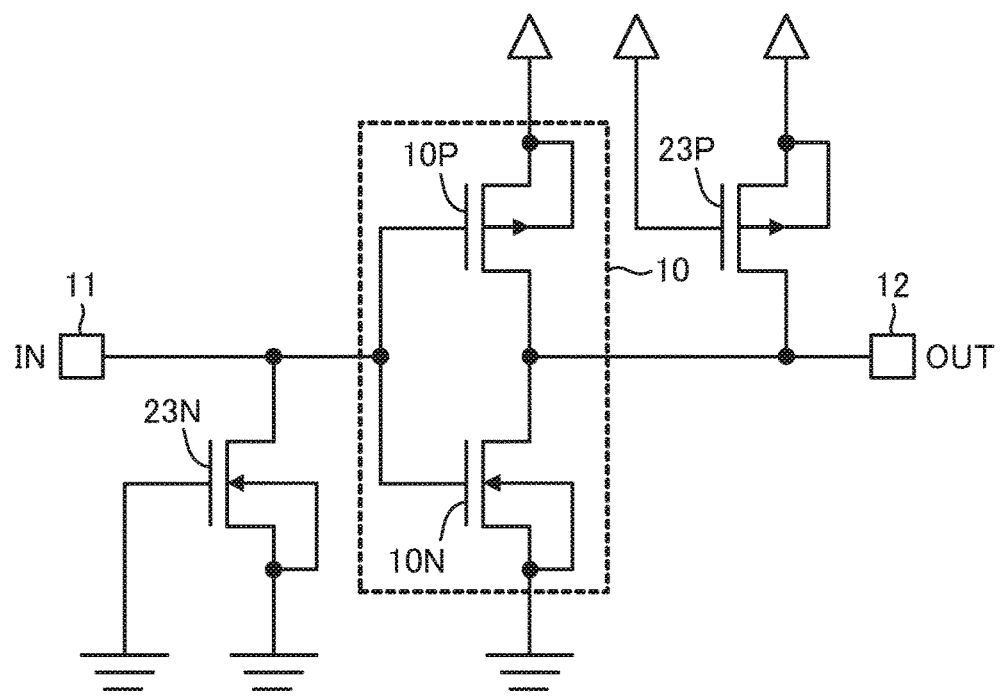
FIG. 11 is a view showing a structure of a circuit block according to another exemplary embodiment of the present disclosure.

FIG. 11 shows an example of the structure of the logic circuit 1A1 according to a fourth exemplary embodiment of the present disclosure. The logic circuit 1A1 is formed so as to include the inverter 10 that outputs from the output terminal 12 a signal created by inverting the logic of a signal input into the input terminal 11. The inverter 10 has the P-channel type of MOSFET 10P, and the N-channel type of MOSFET 10N. The source of the MOSFET 10P is connected to the power supply line, the gate thereof is connected to the input terminal 11, and the drain thereof is connected to the output terminal 12. The source of the MOSFET 10N is connected to the ground line, the gate thereof is connected to the input terminal 11, and the drain thereof is connected to the output terminal 12.

This logic circuit 1A1 additionally has an N-channel type of MOSFET 23N that is connected to the input terminal 11 in such a way as to maintain an OFF state, and a P-channel type of MOSFET 23P that is connected to the output terminal 12 in such a way as to maintain an OFF state.

A source and a gate of the MOSFET 23N are connected to the ground line, while a drain thereof is connected to the input terminal 11. The MOSFET 23N maintains an OFF state as a result of the source and gate thereof being connected to the ground line. A source and a gate of the MOSFET 23P are connected to the power supply line, while a drain thereof is connected to the output terminal 12. The MOSFET 23P maintains an OFF state as a result of the source and gate thereof being connected to the power supply line.

Figure 12:
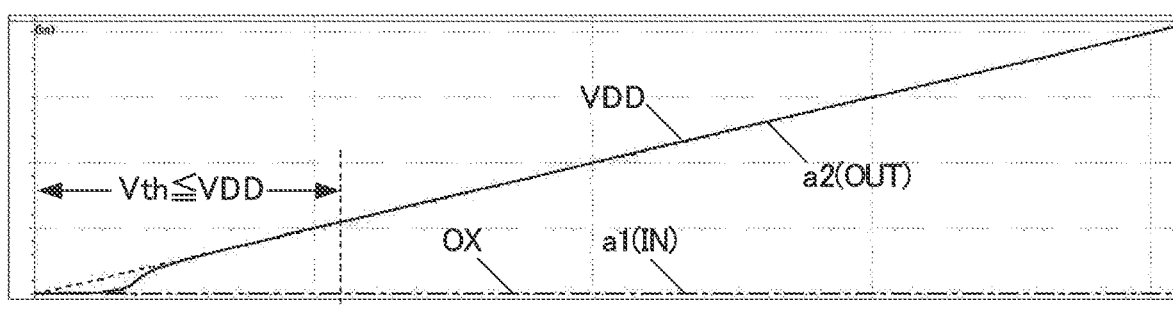

FIG. 12 shows an example of a voltage waveform of each node when the power supply of the circuit block 100A which includes the logic circuit 1A1 according to the present exemplary embodiment (see FIG. 6) is turned on. In areas where the power supply voltage VDD is smaller than the MOSFET gate threshold value voltage Vth (i.e., where Vth≤VDD), in other words, in areas where the circuit is not operating normally, the effects of the MOSFET leakage currents are dominant. In such areas, the potential of the input terminal 11 of the logic circuit 1A1 is fixed at a low level by the leakage current of the MOSFET 23N which is connected to the input terminal 11. Additionally, the potential of the output terminal 12 of the logic circuit 1A1 is fixed at a high level by the leakage current of the MOSFET 23P which is connected to the output terminal 12. As a result, the potential of the output node OX of the subsequent logic circuit 1A2 is fixed at a low level.

According to the circuit block 100A which includes the logic circuit 1A1 according to the present exemplary embodiment, even if the above-described first conditions (|Vtp|≈|Vtn| and Ipk≈Ink, e.g. |Vtp| is nearly equal to |Vtn| and Ipk is nearly equal to Ink) are satisfied, the potential of the output node OX is not undefined, and even when the above-described second conditions (|Vtp|<|Vtn| and Ipk>Ink), or third conditions (|Vtp|>|Vtn| and Ipk<Ink) are satisfied, the potential of the output node OX is not inverted. In other words, it is possible to inhibit a signal having an unintended logic level from being output when the power supply is turned on. Accordingly, it is possible to suppress the risk of a system malfunction being generated when the power supply is turned on. Moreover, because the MOSFET 23P and the MOSFET 23N constantly maintain an OFF state, it is possible to inhibit an increase in the power consumption. Additionally, the MOSFET 23P and 23N do not affect circuit operations.

Fifth Exemplary Embodiment

Figure 13:
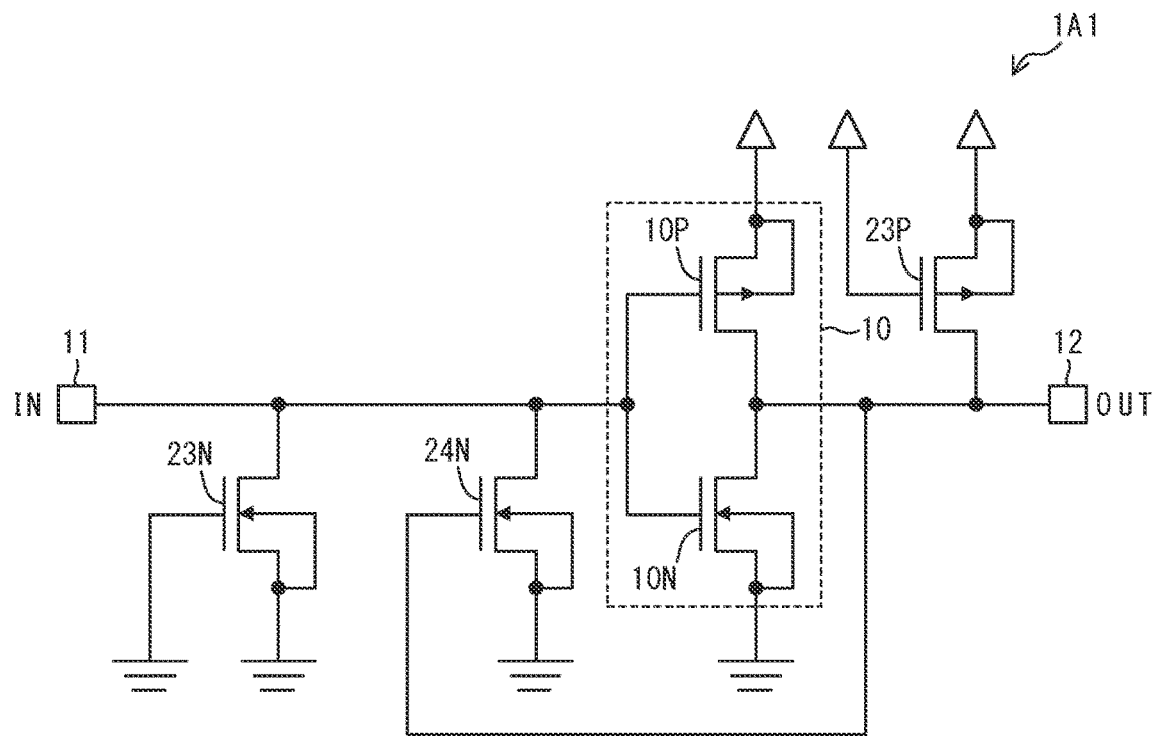
FIG. 13 is a view showing a structure of a circuit block according to another exemplary embodiment of the present disclosure.

FIG. 13 shows an example of the structure of the logic circuit 1A1 according to a fifth exemplary embodiment of the present disclosure. The logic circuit 1A1 is formed so as to include the inverter 10 that outputs from the output terminal 12 a signal created by inverting the logic of a signal input into the input terminal 11. The inverter 10 has the P-channel type of MOSFET 10P, and the N-channel type of MOSFET 10N. The source of the MOSFET 10P is connected to the power supply line, the gate thereof is connected to the input terminal 11, and the drain thereof is connected to the output terminal 12. The source of the MOSFET 10N is connected to the ground line, the gate thereof is connected to the input terminal 11, and the drain thereof is connected to the output terminal 12.

Additionally, the logic circuit 1A1 has the N-channel type of MOSFET 23N that is connected to the input terminal 11 in such a way as to maintain an OFF state, an N-channel type of MOSFET 24N that is connected to the input terminal 11 and enables a latch operation of the inverter 10 to be achieved when the power supply is turned on, and the P-channel type of MOSFET 23P that is connected to the output terminal 12 in such a way as to maintain an OFF state.

Figure 14:
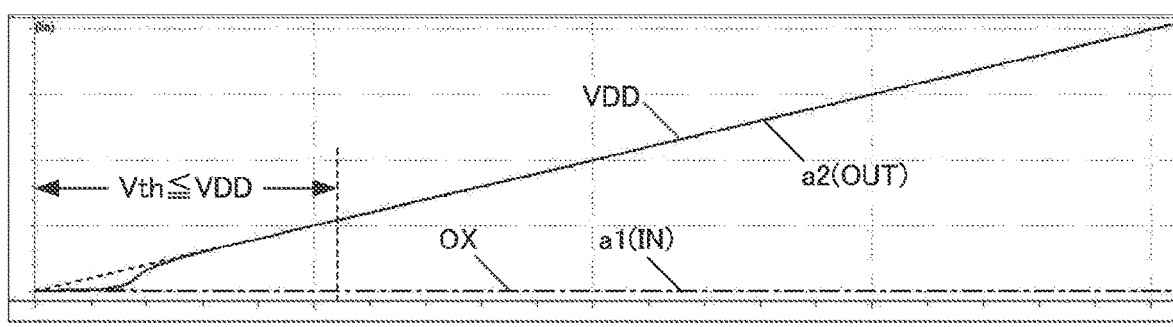

FIG. 14 shows an example of a voltage waveform of each node when the power supply of the circuit block 100A is turned on. In areas where the power supply voltage VDD is smaller than the MOSFET gate threshold value voltage Vth (i.e., where Vth≤VDD), in other words, in areas where the circuit is not operating normally, the effects of the MOSFET leakage currents are dominant. In such areas, the potential of the input terminal 11 of the logic circuit 1A1 is fixed at a low level by the leakage current of the MOSFET 23N which is connected to the input terminal 11. Additionally, the potential of the output terminal 12 of the logic circuit 1A1 is fixed at a high level by the leakage current of the MOSFET 23P which is connected to the output terminal 12. Moreover, as a result of the potential of the output terminal 12 being fixed at a high level, the MOSFET 24N which is connected to the input terminal 11 of the logic circuit 1A1 maintains an ON state. As a result, a latch operation to maintain a state in which the potential of the input terminal 11 is set at a low level, and the potential of the output terminal 12 is set at a high level is achieved. As a result, the potential of the output node OX of the subsequent logic circuit 1A2 is fixed at a low level.

According to the circuit block 100A which includes the logic circuit 1A1 according to the present exemplary embodiment, even if the above-described first conditions (|Vtp|≈|Vtn| and Ipk≈Ink, e.g. |Vtp| is nearly equal to |Vtn| and Ipk is nearly equal to Ink) are satisfied, the potential of the output node OX is not undefined, and even when the above-described second conditions (|Vtp|<|Vtn| and Ipk>Ink), or third conditions (|Vtp|>|Vtn| and Ipk<Ink) are satisfied, the potential of the output node OX is not inverted. In other words, it is possible to inhibit a signal having an unintended logic level from being output when the power supply is turned on. Accordingly, it is possible to suppress the risk of a system malfunction being generated when the power supply is turned on. Moreover, the MOSFET 23P and the MOSFET 23N constantly maintain an OFF state, and the MOSFET 24N is placed in an ON state transiently, however, there is no constant supply of current thereto. Accordingly, it is possible to inhibit an increase in the power consumption. Additionally, the MOSFET 23N, 24N, and 23P do not affect circuit operations. Moreover, because a latch operation is achieved by the MOSFET 24N, the stability of operations when the power supply is turned on can be further heightened.

Exemplary embodiments of the present disclosure have been described above, however, the present disclosure is not limited to these. Various modifications and the like may be made to the present disclosure insofar as they do not depart from the spirit or scope of the present disclosure.

What is claimed is:
1. A logic circuit comprising:
an inverter that outputs from an output terminal a signal created by inverting the logic of a signal input into an input terminal;
a first transistor that is connected to the input terminal in such a way as to maintain an OFF state, one or both of a source and a gate of the first transistor being connected to a first line; and
a second transistor that is connected to the output terminal in such a way as to maintain an OFF state, one or both of a source and a gate of the second transistor being connected to a second line, wherein
one or both of following conditions (i) and (ii) hold:
(i) no transistor is connected between the input terminal and the second line, and
(ii) no transistor is connected between the output terminal and the first line; and
the first line is one of a power supply line and a ground line, and the second line is the other of the power supply line and the ground line.
2. The logic circuit according to claim 1, wherein
the first transistor is a P-channel type MOSFET whose source and gate are connected to the power supply line, and whose drain is connected to the input terminal, and
the second transistor is an N-channel type MOSFET whose source and gate are connected to the ground line, and whose drain is connected to the output terminal.
3. The logic circuit according to claim 2, wherein
the logic circuit further comprises a third transistor that is connected to the input terminal, and
the third transistor is a P-channel type MOSFET whose source is connected to the power supply line, whose gate is connected to the output terminal, and whose drain is connected to the input terminal.
4. The logic circuit according to claim 3, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

5. The logic circuit according to claim 1, wherein
the first transistor is an N-channel type MOSFET whose source and gate are connected to the ground line, and whose drain is connected to the input terminal, and
the second transistor is a P-channel type MOSFET whose source and gate are connected to the power supply line, and whose drain is connected to the output terminal.

6. The logic circuit according to claim 5, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

7. The logic circuit according to claim 1, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

8. The logic circuit according to claim 2, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

9. A logic circuit comprising:
an inverter that outputs from an output terminal a signal created by inverting the logic of a signal input into an input terminal;
a first transistor that is connected to the input terminal in such a way as to maintain an OFF state; and
a second transistor that is connected to the output terminal in such a way as to maintain an OFF state, wherein
the first transistor is a P-channel type MOSFET whose source and gate are connected to a power supply line, and whose drain is connected to the input terminal, and
the second transistor is a P-channel type MOSFET whose source is connected to the output terminal, whose gate is connected to a power supply line, and whose drain is connected to a ground line.

10. The logic circuit according to claim 9, wherein
the logic circuit further comprises a third transistor that is connected to the input terminal, and
the third transistor is a P-channel type MOSFET whose source is connected to the power supply line, whose gate is connected to the output terminal, and whose drain is connected to the input terminal.

11. The logic circuit according to claim 10, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

12. The logic circuit according to claim 9, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

13. A logic circuit comprising:
an inverter that outputs from an output terminal a signal created by inverting the logic of a signal input into an input terminal;
a first transistor that is connected to the input terminal in such a way as to maintain an OFF state;
a second transistor that is connected to the output terminal in such a way as to maintain an OFF state; and
a third transistor that is connected to the input terminal, wherein
the first transistor is an N-channel type MOSFET whose source and gate are connected to a ground line, and whose drain is connected to the input terminal,
the second transistor is a P-channel type MOSFET whose source and gate are connected to a power supply line, and whose drain is connected to the output terminal, and
the third transistor is an N-channel type MOSFET whose source is connected to the ground line, whose gate is connected to the output terminal, and whose drain is connected to the input terminal.

14. The logic circuit according to claim 13, wherein the inverter includes:
a P-channel type MOSFET whose source is connected to the power supply line, whose gate is connected to the input terminal, and whose drain is connected to the output terminal; and
an N-channel type MOSFET whose source is connected to the ground line, whose gate is connected to the input terminal, and whose drain is connected to the output terminal.

* * * * *